United States Patent
Huang et al.

(10) Patent No.: US 7,353,162 B2
(45) Date of Patent: Apr. 1, 2008

(54) SCALABLE RECONFIGURABLE PROTOTYPING SYSTEM AND METHOD

(75) Inventors: Thomas B. Huang, San Jose, CA (US); Mon-Ren Chene, Saratoga, CA (US)

(73) Assignee: S2C, Inc., San Jose, CA (US)

( * ) Notice: Subject to any disclaimer, the term of this patent is extended or adjusted under 35 U.S.C. 154(b) by 309 days.

(21) Appl. No.: 11/056,961

(22) Filed: Feb. 11, 2005

(65) Prior Publication Data

US 2006/0184350 A1    Aug. 17, 2006

(51) Int. Cl.
    *G06F 9/455* (2006.01)
(52) U.S. Cl. ............... 703/23; 703/27; 703/20; 703/17; 714/727; 714/733; 714/724; 716/17
(58) Field of Classification Search .......... 703/26, 703/27, 17, 20; 714/727, 733, 724, 48; 717/4; 307/87; 716/17; 326/93; 375/141; 702/108
    See application file for complete search history.

(56) References Cited

U.S. PATENT DOCUMENTS

| | | | |
|---|---|---|---|
| 5,329,470 A | 7/1994 | Sample | 703/28 |
| 5,425,036 A | 6/1995 | Liu | 714/735 |
| 5,448,496 A | 9/1995 | Butts | 716/16 |
| 5,477,475 A | 12/1995 | Sample | 716/16 |
| 5,596,742 A | 1/1997 | Agarwal | 716/16 |
| 5,644,515 A | 7/1997 | Sample | 703/23 |
| 5,649,176 A | 7/1997 | Selvidge | 713/400 |
| 5,657,241 A | 8/1997 | Butts | 716/16 |
| 5,659,716 A | 8/1997 | Selvidge | 703/23 |
| 5,661,662 A | 8/1997 | Butts | 716/16 |
| 5,761,484 A | 6/1998 | Agarwal | 716/16 |
| 5,802,348 A | 9/1998 | Stewart | 703/25 |
| 5,835,751 A | 11/1998 | Chen | 713/400 |
| 5,841,967 A | 11/1998 | Sample | 714/33 |
| 5,847,578 A | 12/1998 | Noakes | 326/39 |
| 5,850,537 A | 12/1998 | Selvidge | 716/12 |
| 5,870,410 A | 2/1999 | Norman | 714/725 |
| 5,884,066 A | 3/1999 | Kuijsten | 703/28 |
| 5,923,865 A | 7/1999 | Chilton | 703/23 |
| 5,943,490 A | 8/1999 | Sample | 703/28 |
| 5,960,191 A | 9/1999 | Sample | 703/28 |
| 5,963,735 A | 10/1999 | Sample | 703/24 |
| 6,002,861 A | 12/1999 | Butts | 703/16 |
| 6,009,256 A | 12/1999 | Tseng | 703/13 |
| 6,026,230 A | 2/2000 | Lin | 703/13 |
| 6,134,516 A | 10/2000 | Wang | 703/27 |
| 6,285,211 B1 | 9/2001 | Sample | 326/41 |
| 6,289,494 B1 | 9/2001 | Sample | 716/12 |
| 6,321,366 B1 | 11/2001 | Tseng | 716/6 |
| 6,377,911 B1 | 4/2002 | Sample | 703/24 |

(Continued)

*Primary Examiner*—K. Thangavelu
(74) *Attorney, Agent, or Firm*—Edward C. Kwok; MacPherson Kwok Chen & Heid LLP

(57) ABSTRACT

A method and a system provide a reconfigurable platform for designing and emulating a user design. The method and system facilitates design and emulation of a system-on-a-chip type user design. The netlist of a user design may be included with netlists from customized or optimized third party circuits in an emulation using a platform including a number of field programmable devices. Various customized circuits for specific development activities, such as debugging, performance analysis, and simulator linkage may be configured to interact with the user design.

63 Claims, 6 Drawing Sheets

U.S. PATENT DOCUMENTS

| | | | |
|---|---|---|---|
| 6,377,912 B1 | 4/2002 | Sample | 703/28 |
| 6,389,379 B1 | 5/2002 | Lin | 703/14 |
| 6,539,535 B2 | 3/2003 | Butts | 716/17 |
| 6,625,793 B2 | 9/2003 | Sample | 716/12 |
| 6,651,225 B1 | 11/2003 | Lin | 716/4 |
| 6,654,919 B1* | 11/2003 | Watkins | 714/733 |
| 6,678,645 B1* | 1/2004 | Rajsuman et al. | 703/20 |
| 6,754,763 B2 | 6/2004 | Lin | 710/317 |
| 6,785,873 B1 | 8/2004 | Tseng | 716/4 |
| 6,810,442 B1 | 10/2004 | Lin | 710/22 |
| 6,832,185 B1 | 12/2004 | Musselman | 703/23 |
| 6,842,729 B2 | 1/2005 | Sample | 703/24 |
| 2002/0035721 A1* | 3/2002 | Swoboda | 717/4 |
| 2002/0095649 A1 | 7/2002 | Sample | 716/12 |
| 2002/0109413 A1* | 8/2002 | Malinovitch | 307/87 |
| 2002/0133325 A1* | 9/2002 | Hoare et al. | 703/17 |
| 2003/0074178 A1 | 4/2003 | Sample | 703/25 |
| 2003/0126533 A1* | 7/2003 | McAdams | 714/727 |
| 2003/0138030 A1* | 7/2003 | Gavnoudias et al. | 375/141 |
| 2003/0154458 A1* | 8/2003 | Butts et al. | 716/17 |
| 2004/0075469 A1* | 4/2004 | Reblewski et al. | 326/93 |
| 2004/0138845 A1* | 7/2004 | Park et al. | 702/108 |
| 2004/0148153 A1 | 7/2004 | Beletsky | 703/27 |
| 2004/0153877 A1* | 8/2004 | Agarwala | 714/48 |
| 2004/0254779 A1* | 12/2004 | Wang et al. | 703/27 |
| 2006/0156099 A1* | 7/2006 | Sweet et al. | 714/724 |

* cited by examiner

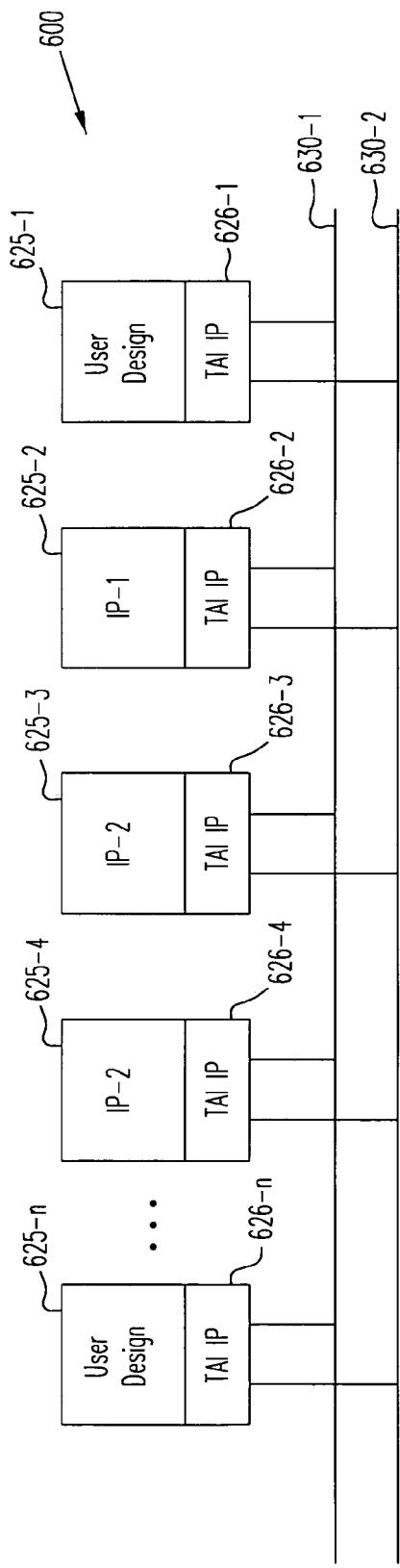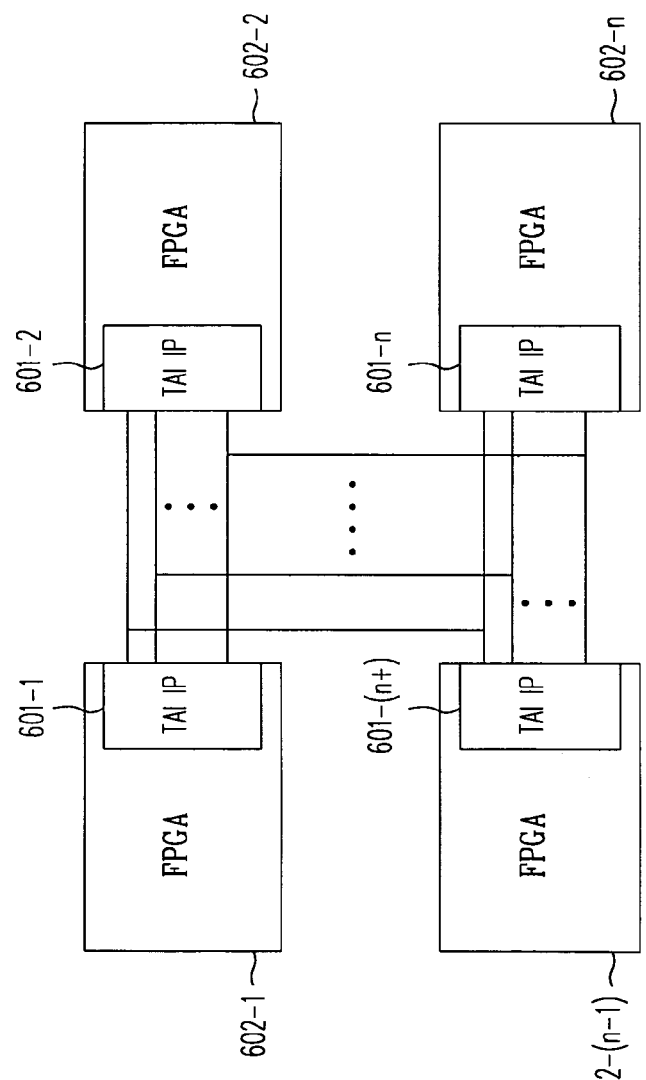
FIG. 6a
FIG. 6b

SCALABLE RECONFIGURABLE PROTOTYPING SYSTEM AND METHOD

BACKGROUND OF THE INVENTION

1. Field of the Invention

The present invention relates to automation and validation techniques for designing electronic circuits. In particular, the present invention relates to automation and validation techniques for designing electronic circuits that are particularly applicable to system-on-a-chip type electronic circuits.

2. Description of the Related Art

As the level of integration advances, many complex logic systems can now be implemented on a single integrated circuit. Such an integrated circuit, known as "system on a chip", includes a number of complex components (e.g., micro-processor, peripheral and memory controllers), many of which may be individually obtained as "off-the-shelf" electronic circuit designs from a number of vendors. These electronic circuit designs are known as "IPs[1]" to those skilled in the art.

In the prior art, debugging a system that includes a user design integrated with one or more third party IPs is difficult, as the designer of the user design often does not have complete control over the IPs timing and logical behavior at the interfaces between the user design and the IPs. For example, incorrectly behaving output signals of the user design may cause unpredictable behavior in the IPs, which may in turn be fed back into the user design to cause unpredictable states in the user design. Such errors are extremely difficult to diagnose and isolate. Thus, a design tool that provides the designer of the user design control over the interfaces between the user design and the IPs is desired.

[1] The term "IP" stands for "intellectual property." Designers of these electronic circuits provide the designs to their customers in the form of data files which are readable by popular electronic design automation (EDA) tools. The customers of these vendors then integrate these "IPs" into their own circuit designs. As an IP vendor does not provide a manufactured article—the electronic deign is typically provided as data represented in electronic form (e.g., stored in a storage medium, such as a compact disk, or as a stream of bits downloaded from a server on the internet)—it has become customary in the art to refer to such electronic circuit design products as "IPs".

SUMMARY

The present invention provides a method and a system using a reconfigurable platform for designing and emulating a user design. The method of the present invention is particularly suited to an IP re-use methodology, such as system-on-a-chip type user design, in which a user's own design is implemented with the user's own design and frequently also with third party IPs. The present invention may be implemented on a platform including memories and a number of field programmable logic devices, such as programmable gate arrays. Various customized circuits for specific development activities, such as debugging, performance analysis, and simulator linkage may be configured to interact with the user design.

According to one embodiment of the present invention, the system for designing and emulating a user design includes (i) a system controller having an interface to a user workstation and a data communication interface; and (ii) an emulation platform coupled to the data communication interface having multiple field programmable logic devices and memories for implementing the user design and third party IPs, and an interface to a target system with which the user design interacts at run time. The data communication interface may include a configuration bus, a system utility bus, and a bus for clock signals. The interface to a target system includes signals originating from programmable input/output terminals of the programmable logic devices.

According to one embodiment of the present invention, using the system for designing and emulating the user design, a user generates a top-level module including the user design and one or more third party IPs. The user then synthesizes the user design. The user design and the third party IPs are then integrated into partitions each suitable for implementing in one or more of the programmable logic devices. In addition, each programmable logic device and each IP is assigned an interface module. Through the interface module, each IP to be implemented in a programmable logic device is allowed communicate within any partition in that programmable logic device or with other partitions in other programmable logic devices. The partitions and the interface modules are then placed and routed and implemented in the programmable logic devices.

According to one embodiment of the present invention, the interface module assigned to each IP or each programmable logic device includes a control circuit and a programmable number of input/output cells, each providing a 1-bit interconnection port. In that embodiment, each input/output cell includes a dynamically reconfigurable memory module, a multiplexer for selecting an output signal for output onto the 1-bit interconnection port from selected signals configured in the programmable logic device, and a number of latches each selectable to receive a signal from the 1-bit interconnection port. The multiplexer and the latches may be controlled by the words stored in the dynamically reconfigurable memory module, which may be implemented by one or more dynamically reconfigurable memory elements, and accessed by addresses generated by a state machine (e.g., a counter). The dynamically reconfigurable memory module may operate using a clock signal of a higher frequency that the clock signals used by the user design.

The interface module may be used to implement an output port, an input port, a bidirectional port or a tristate port. In addition, the port type implemented in the interface module may be dynamically changed. The interface module can also be configured to isolate the IP assigned to a programmable logic device from partitions in the same or other programmable logic device according to specified testing or debugging conditions (e.g., during boundary scan operations).

According to one embodiment of the present invention, one or more of the programmable logic devices may be assigned a verification IP for verifying functional operation of the user circuit. Such a verification IP may include, for example, a circuit for simulating the operations of an industry standard data bus.

According to another embodiment of the present invention, one or more of the programmable logic devices may be assigned a performance analysis IP, which may include, for example, an IP or a bus for bandwidth analysis.

According to one embodiment of the present invention, the system may provide a configuration tool capable of dynamically reconfiguring logic circuits assigned to a selected programmable logic device. The configuration tool may also include a backplane configuration tool capable of dynamically reconfiguring buses on a circuit board on which the programmable logic devices are located.

According to one embodiment of the present invention, the system may provide a system debugging tool for monitoring and analyzing signals in and between the programmable logic devices during run time. The system debugger tool may include an FPGA read back tool, a system utility bus access tool, an internal logic analyzer tool, a bandwidth analyzer tool, a symbol/transaction extraction tool, and a simulator linkage tool. The internal logic analyzer tool inserts into one or more of the programmable logic devices a circuit implementing a logic analyzer. The symbol/transaction extraction tool allows a user to associate one or more signals with a symbolic name and to specify a transaction involved multiple signals. The transaction may be specified by the signal transitions in the waveforms of the signals over a selected duration. The debugging tool is capable of reporting detection of the specified transaction using the associated symbols. The simulator linkage tool allows the user design to interact with a simulator program running on the user station in a co-emulation arrangement.

The present invention is better understood upon consideration of the following detailed description and the accompanying drawings.

BRIEF DESCRIPTION OF THE DRAWINGS

FIG. 6a shows schematically a system-on-chip design 620 including both user design circuits and IPs are partitioned into circuits 625-1 to 625-n, associated with TAI-IPs 626-1 to 626-n, respectively, in accordance with one embodiment of the present invention.

FIG. 6b is a block diagram showing TAI IPs 601-1 to 601-n, when implemented in SR FPGA array 103, serving as interfaces among FPGAs 602-1 to 602-n.

DETAILED DESCRIPTION OF THE PREFERRED EMBODIMENTS

Figure 1:
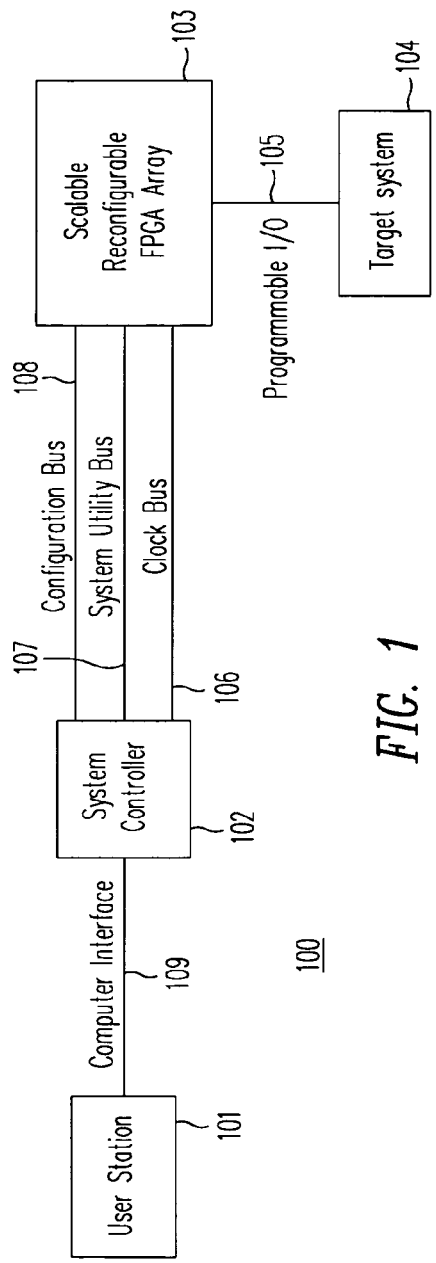
FIG. 1 shows SR prototyping system 100, in accordance with one embodiment of the present invention.

FIG. 1 shows electronically reconfigurable prototyping system 100, in accordance with one embodiment of the present invention. As shown in FIG. 1, electronically reconfigurable prototype system 100 includes scalable reconfigurable (SR) prototyping platform 103, which may be implemented by one or more arrays of field programmable gate array (FPGA) integrated circuits. SR prototyping platform 103 interacts with a target system 104 (i.e., the system with which the prototyped system is expected to interface) over programmable input/output terminals 105, which are driven, for example, from the pins of the FPGA integrated circuits. SR prototyping platform 103 is controlled by system controller 102 over one or more data buses. In this embodiment, the data buses include system configuration bus 108, system utility bus 107 and clock bus 106. System configuration bus 108 is provided for configuring the FPGA integrated circuits, system utility bus (SUB) 107 is provided to allow data communication between system controller 102 and SR prototyping platform 103 during system operations (e.g., prototyping), and clock bus 106 provides one or more time bases to operate SR prototyping platform 103.

User station 101 provides a graphical user interface to a human user for controlling the operations of electronically reconfigurable prototyping system 100. Through the graphical user interface, a user of user station 101 may typically access a user design, a compiler for transforming a user design to configuration signals for SR prototyping platform 103, various IP libraries, various electronic design automation (EDA) software, and runtime software. User station 101 may be implemented by an engineering workstation or a personal computer. In this embodiment, user station 101 communicates with system controller 102 through industry standard communication interface 109, which may be implemented, for example, by a USB, PCI, IEEE-1394 ("firewire") or another industry standard bus.

In this embodiment, a user design may be entered or edited using conventional circuit schematic tools or expressed in a behavior or hardware (e.g., circuit level) description language (e.g., HDL, SystemC, Verilog, SystemVerilog, SystemVHDL, VHDL), which may then be used to synthesize into a logic gate level schematic. The present invention allows the synthesized circuits to be emulated or verified in a hardware prototyping system, such as electronically reconfigurable system 100.

Figure 2:
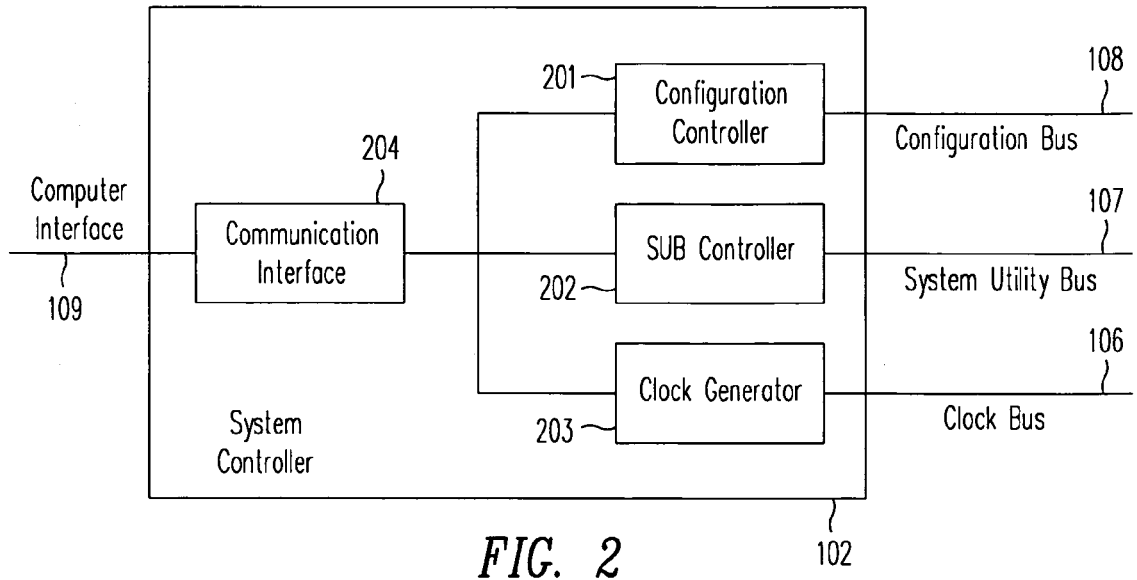
FIG. 2 is a block diagram of system controller 102 of SR prototyping system 100.

FIG. 2 is a block diagram of system controller 102, which includes communication interface 204, SUB controller 202, clock generator 203 and configuration controller 201. Configuration controller 201 handles configuration signal protocols and transfers configuration data from user station 101 to SR FPGA array 103 over configuration bus 108, so as to configure or down-load a user design in a preferred format to the FPGAs in SR FPGA array 103. Configuration bus 108 is also used to read back the design in each FPGA for verification purpose and to retrieve state information and data in the user design during runtime. Typically, read back operations are performed using conventional techniques or using vendor provided protocols, such as SelectMap and JTAG. In one embodiment, configuration bus 108 may be used to test the FPGAs in scalable FPGA array 103 in prototyping system 100.

SUB controller allows SUB 107 run-time access to registers, FIFOs, memories and other state elements in design and system specific components, such as special logic blocks (e.g., IPs) inserted to user design by compiler software. SUB 107 may also be used to reset or initialize the FPGAs in SR FPGA array 103 to designated working states.

Clock generator 203 drives clock bus 106 to provide FPGA array with various clock signals of programmable frequencies and duty cycles to be used by the user design downloaded into SR FPGA array 103.

Figure 3:
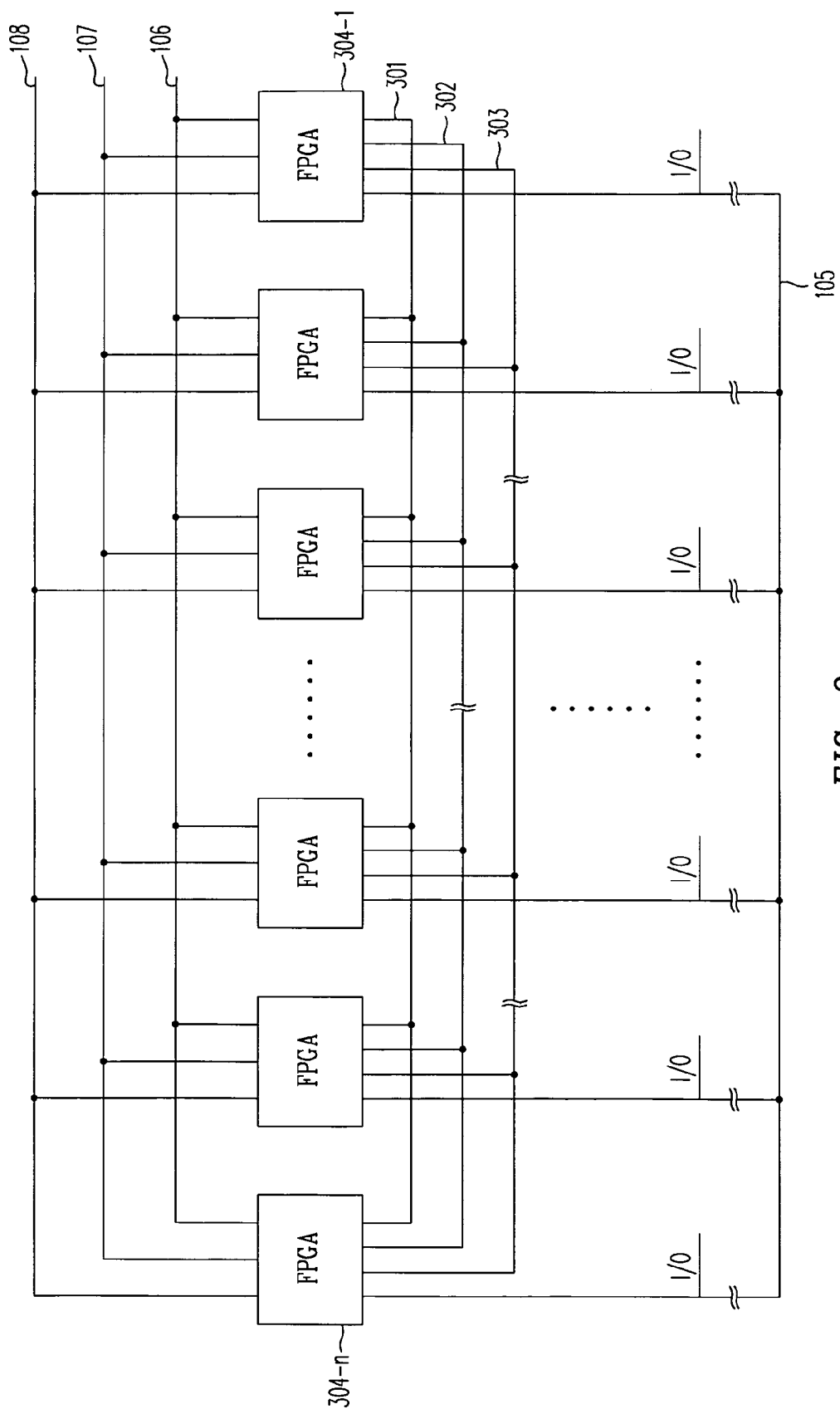
FIG. 3 shows one example of a schematic configuration of SR FPGA array 103.

As mentioned above, SR FPGA array 103 may be implemented using one or more scalable backplanes or circuit boards, FPGAs and dynamically configurable circuit switches. SR FPGA array 103 may contain any number of FPGAs and switches. FIG. 3 shows one example of a schematic configuration of SR FPGA array 103. As shown in FIG. 3, shows SR FPGA array 103 implemented by FPGA 304-1 to 304-n. Every of FPGAs 304-1 to 304-n has more than one connection to other FPGAs. In this embodiment, one or more buses (e.g., buses 301-303[2]) are provided for interconnecting FPGAs 304-1 to 304-n. In this manner, signals can be routed from any FPGA to any other FPGA. Buses 301-303 may be configured as "global buses" (i.e., buses to which each FPGA is given access). Alternatively, buses 301-303 also may be assigned in various configurations, so that each bus can be programmed to be dedicated to a selected group of FPGAs. The buses may also be interconnected with each other dynamically configurable circuit switches. These circuit switches may be provided by custom switch circuits or configured into FPGAs 304-1 to 304-*n*. The FPGAs can also be configured into a hierarchical structure in which the FPGAs may be grouped, such that the FPGAs in each group are interconnected by a "local" connection bus, and these local connection buses are interconnected with each other by one or more levels of dynamically reconfigurable switches. In addition, each FPGA may have one or more input or output (I/O) signals that are provided on I/O bus 105 for communicating signals to and from target system 104. These I/O signals may also be interconnected through one or more levels of dynamically configurable switches to allow data communication among the FPGAs. However, the number of connections is not limited as technology improves and advances. Preferably, the interconnection buses and switches are implemented on one or more backplanes or circuit boards. Alternatively, any interconnection bus (e.g., any of buses 301-303, configuration bus 108, SUB 107 or clock bus 106) may also be implemented by cables, optical fibers or other means of interconnection.

[2] FIG. 3 shows three buses, buses 301-303. This number of buses is provided solely for illustrative purpose. Any number of buses may be used in any implementation.

A complex digital system (e.g., a system-on-a-chip (SoC) design or an application-specific circuit) typically includes multiple sub-systems. For example, an SoC design may include such subsystems as a multi-media sub-system, a signal processing sub-system, a peripheral controller sub-system, and a central processor. Each sub-system may be configured into, for example, a selected group of FPGAs interconnected by a common local bus. Dynamically configurable switches may then be used to couple the common local bus to other buses in the system. The common local bus may also be a global bus configured to be in an "off"-mode (break connection), so as to dedicate the common local bus for use within the sub-system. Switches between local buses may be configured in an "on"-mode for intercommunication between sub-systems. Global bus may be used for communication between sub-systems or point-to-point communication between FPGAs.

Figure 4:
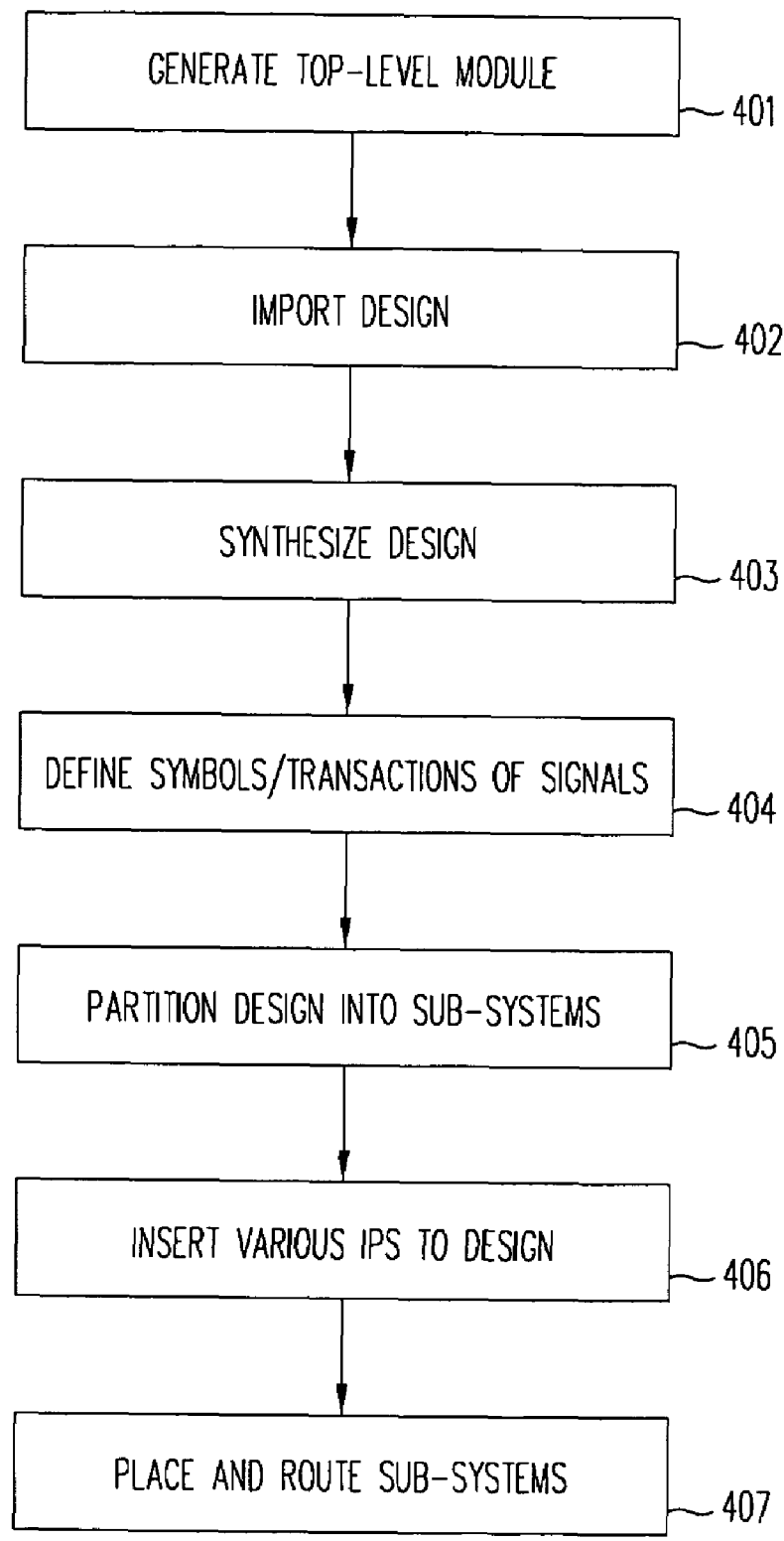
FIG. 4 shows an exemplary flow of a compiler program, in accordance with one embodiment of the present invention.

To implement a user design into SR FPGA array 103, a compiler is invoked in user station 101. FIG. 4 shows an exemplary flow of a compiler program, in accordance with one embodiment of the present invention. As shown in FIG. 4, at step 401, a system designer may invoke a top-level module generator to generate a top-level module for the user design, which may include custom design components and $3^{rd}$ party IPs. This top-level module generator, which facilitates integration of various designs and IPs from both the user's own library and $3^{rd}$ party vendors, automatically connects user design components and $3^{rd}$ party IPs using standard bus definitions and user defined bus and signal connection relationships. Alternatively, a system designer may also manually create the top-level module without using an automatic top-level module generator.

At step 402, a system or circuit designer causes the compiler (e.g., using a "import design" command) to import the designs of each component in the top-level module. The design is typically expressed in a hardware description language (HDL) or a netlist. The compiler checks the design for syntax, synthesizability and completeness (i.e., whether or not all logic components included in the design source are available or linkable in a predefined library or a database of logic representations). If an error exists in imported design or a logic block is not available in the library, the compiler software reports an import error. Step 402 may be performed as many times as necessary, until all input sources are checked and accepted by compiler.

After the design is imported, at step 403, the designer may synthesize all remaining hardware descriptions (HDL or other formats) in the design using, for example, a "synthesize" command in the compiler or a 3d party synthesis tool callable by the compiler. In one embodiment, the compiler synthesizes a third party IP in a bottom-up fashion to preserve the block signal boundaries of the third party IP and to preserve the run time performance. The synthesized design consists then of netlists that can be used to configure the FPGAs in SR FPGA array 103 (e.g., EDIF files). In one embodiment, the compiler merges all the EDIF files into one EDIF file to represent the user design.

Figure 5:
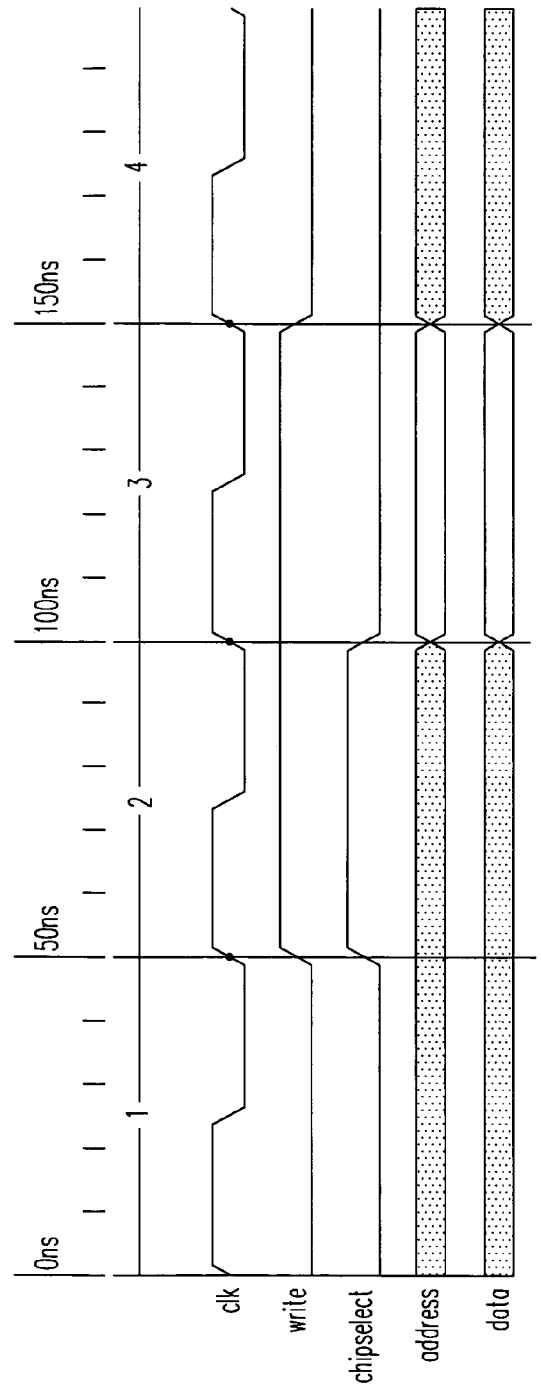
FIG. 5 shows waveforms for a convention "write" transaction in a storage device.

In this embodiment, at step 404, after a design is synthesized, the designer may invoke a "symbol-definition" command in the compiler to start a symbol-definition process. In the symbol definition process, a user may define as a symbol any individual signal, or group of signals. Of significance is that any number of signals may be defined in one symbol. In addition, a user may also define a transaction, which is a set of events, or waveforms of arbitrary duration, for a specified group of symbols or signals. When the state transitions of the signals or the symbols match the specified waveforms within a specified time period defined for the transaction, the transaction is deemed to have taken place. For example, FIG. 5 shows waveforms for a convention "write" transaction in a storage device. As shown in FIG. 5, the "write" transaction involves the signal waveforms of a group of five symbols: individual signals "clk", "write", and "chipselect" and buses "address" and "data". In this example, the transaction has a two-cycle duration, shown in FIG. 5 as cycles 1 and 2 between time 0 ns to 100 ns. During this time, the "chipselect" and the "write" control signals are both asserted for one cycle of the "clk" signal. The waveforms of the specified signals within the two clock cycles define the transaction. To detect the occurrence of the transaction, prototyping system 100 may be configured to monitor the specified signals at run time and to compare the signal transitions to the predefined signal transitions for the transaction. Unlike the prior art, when the transaction is detected, the software reports user the occurrence of the transaction, rather than a collection of signal states that are left to the user to decipher. In this manner, the transaction is reported to the user at a high-level abstraction, which may be used in debugging. In one embodiment, the signals states are sampled and stored in an on-board memory, or in a memory or file image on user station 101, to allow further analysis. The symbols and transactions defined are particular useful in debug mode, and the same signal comparison and transaction detection processes are performed during debug mode as in the run time described above. A circuit designer may define as many symbols and transactions as needed, so that a large amount of run time signal information may be specified at a high level for debug purpose. Symbols and transactions defined during debug can be transferred to allow observation and manipulation during runtime.

At step 405, a user may use a "partition" command in the compiler to partition the design into partitions of the user design, each partition being intended for implementation in a single FPGA. Third party IPs are also partitioned for implementation in FPGAs. A large IP may be partitioned into more than one FPGA. In one embodiment, the partition command invokes a third party partition tool. Because of the interconnection scheme using the "TAI IP cell" described below, a partition tool in prototyping system 100 can optimize partitioning according to an objective of maximizing the utilization of FPGA capacity, without being constrained by FPGA pin usage. The partitioner generates a separate netlist for each FPGA in SR FPGA array. Partitioning step 405 preserves all design information and functions of the user design. Alternatively, 3$^{rd}$ party partitioners or manual partition may be used to partition the design. The partitioner may allow constraints to be specified, which guide the partitioner to generate a netlist that targets the intended hardware of SR FPGA array 103.

At step 406, after a user design is partitioned, the compiler inserts into the netlist of each FPGA partition a customized circuit structure that is designed to provide "testability", "analysis" and "interconnection" capabilities. This customized circuit structure, called "TAI IP," is also inserted with each IP, or each portion of an IP partitioned into an FPGA. The resulting circuit topology is shown in a logical view in FIG. 6a. As shown in FIG. 6a, a system-on-chip design 620 including both user design circuits and third party IPs are partitioned into circuits 625-1 to 625-n, each being with TAI-IPs 626-1 to 626-n, respectively, in accordance with one embodiment of the present invention. Each of circuits 625-1 to 625-n is either a partition of a user design circuit to be implemented in an FPGA, an IP, or a portion of an IP to be implemented in an FPGA. In some instances, a partition of a user design may be assigned to the same FPGA. Each of circuits 625-1 to 625-n communicate with each other through their associated TAI IPs 626-1 to 626-n over one or more communication buses or channels, shown schematically as buses 630-1 to 630-2. (Although only two buses are shown in FIG. 6a, the communication channel may consist of a single bus or more than two buses, depending on user preference and the connectivity among the circuits).

Figure 7:
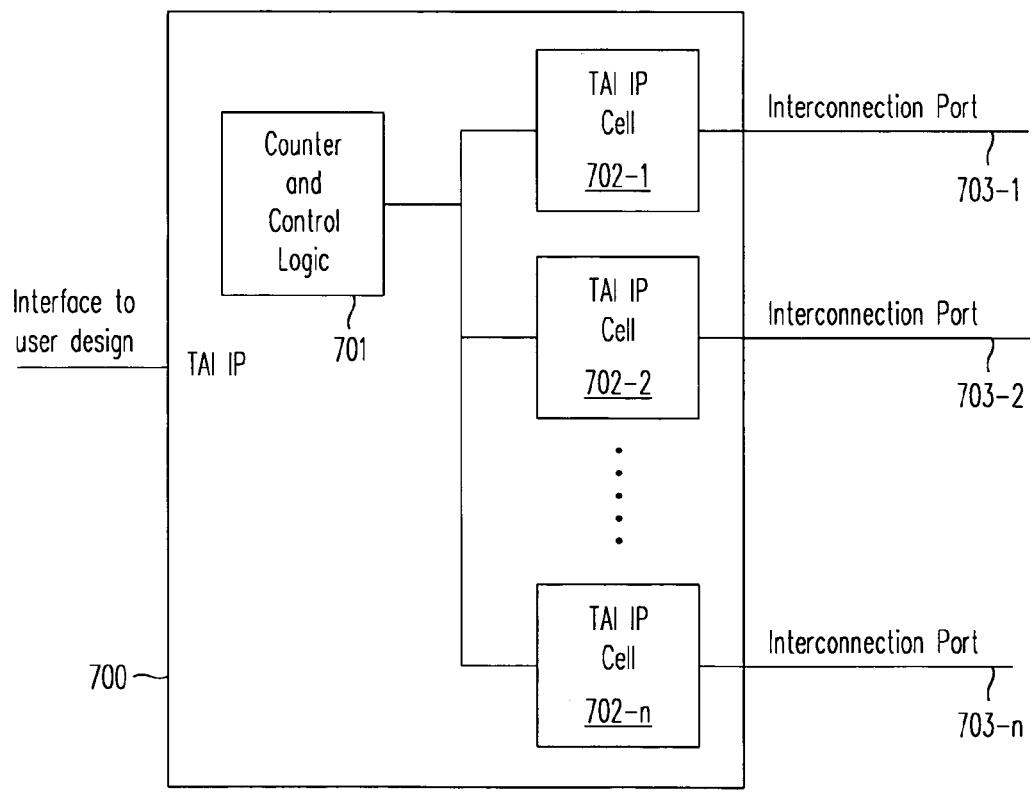
FIG. 7 is a block diagram of a TAI IP 700, according to one embodiment of the present invention.

FIG. 6b is a block diagram showing TAI IPs 601-1 to 601-n, when implemented in SR FPGA array 103, serving as interfaces among FPGAs 602-1 to 602-n. As shown in FIG. 6b, each TAI IPs of an FPGA is connected to other TAI IPs of other FPGAs to provide interconnectivity among the FGPAs of SR FPGA array 103. With respect to the IPs, each IP in an FPGA communicates with circuits assigned to that FPGA and with other circuits in other FPGA through its associated TAI IP. Under this arrangement, input into and output from an IP may be controlled through the TAI IP. For example, each output signal of the IP can be isolated from the user design and signal states be substituted in their stead for debugging purpose. In addition, the input and output signals of the IP can be independently monitored to improve testability, FIG. 7 is a block diagram of a TAI IP 700, according to one embodiment of the present invention. As shown in FIG. 7, TAI IP 700 includes control circuit 701, which controls TAI IP building block circuits ("TAI IP cells") 702-1 to 702-n. The number of TAI IP cells in each TAI IP is a programmable design parameter, typically defined according to the number of FPGAs on a FPGA array board to be interconnected, the input and output requirements of the user designed, and user specification. Each TAI IP cell is connected to a bus on the circuit board of SR FPGA array 103 through 1-bit interconnection port (e.g., one of interconnection ports 703-1 to 703-n). Based on these requirements, the compiler determines the number of the TAI IP cells required and generates the required TAI IP cells and control circuit in the TAI IP of each FPGA.

Figure 8:
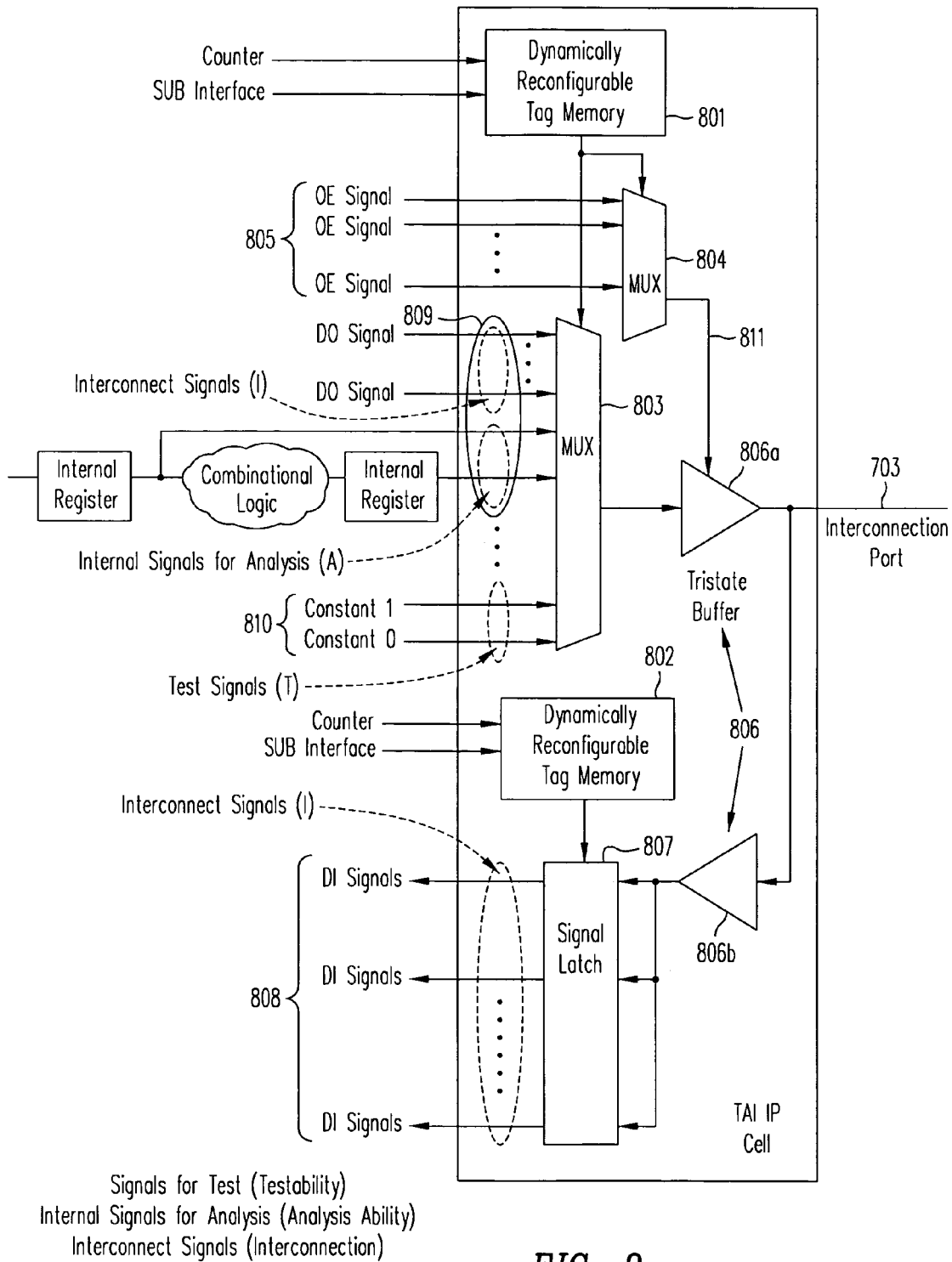
FIG. 8 shows TAI IP cell 800, in accordance with one embodiment of the present invention.

FIG. 8 shows TAI IP cell 800, in accordance with one embodiment of the present invention. As shown in FIG. 8, TAI IP cell 800 includes dynamically reconfigurable tag memories 801 and 802, signal multiplexer 803, bi-directional buffer 806 (including output buffer 806a and input buffer 806b) and signal latch 807. Dynamically reconfigurable tag memory 801 controls the multiplexing of both data output signals 808 and corresponding output enable (OE) signals 805. Data output signals 809 and corresponding output enable signals 805 include the output signals in the user design configured in the FPGA, and signals at specified internal logic nodes. In addition, constant signals 810[3] (including a constant "0" and a constant "1") may also be selected by signal output multiplexer 803 for transmission over interconnection port 703. Under this arrangement, one signal output is provided on interconnection port 703 at any given time. Unassigned signals in data output signals 809 may be connected to any arbitrary values. As described below, such an arrangement allows incremental signal configuration at run time without full recompilation. Unused OE Signals are assigned to an unasserted signal state, so as to prevent unintentionally outputting a value onto interconnection port 703 at any time.

Dynamically reconfigurable tag memory 802 controls a set of signal latches, each of which can be selected to latch the input signal on interconnection port 703. As discussed above, interconnect port 703 receives signals from other FPGAs through over one bit of an interconnection bus. The output signals of signal latches 807 drive signals 808, which are coupled to input ports of elements in the user design. Unassigned signals in input signals 808 may be left disconnected.

Both dynamically reconfigurable tag memories 801 and 802 are addressed by signals from control counters, so that dynamically reconfigurable tag memories 801 and 802 can be loaded from SUB bus 107 during run time. Multiplexer 804 controls the direction of bi-directional buffer 806, thereby determining whether interconnection port 703 is an input port, an output port or a bi-directional port. The select signals at multiplexer 804 can be dynamically changed during run time to reconfigure the port type during run time. In the embodiment shown in FIG. 8, multiplexers 803 and 804 select from the same number of signals and are controlled simultaneously by the same control signals from dynamically reconfigurable tag memory 801. In this configuration, corresponding signals input to multiplexers 803 and 804 are selected. Such an arrangement is, of course, not necessary. Multiple multiplexers, controlled from different fields of an output word of dynamically reconfigurable tag memory 801 may be used to select from design output signals 809 and OE signals 805.

A tri-statable output port may be implemented by providing the data output signal as one of signals 809 and the corresponding OE signal as the corresponding one of OE signals 805. A high impedance state is achieved when the corresponding OE signal is de-asserted. Similarly, a bi-directional port may be implemented by providing the bi-directional signal simultaneously as one of data output signals 809 and data input signals 808, and the corresponding OE signal as one of OE signals 805. The compiler ensures that the bidirectional port is correctly mapped, so that the corresponding locations in dynamically reconfigurable tag memories are always selected simultaneously. In one embodiment, the bi-directional signal is mapped into the locations of the same address in dynamically reconfigurable tag memories 801 and 802.

[3]The constant signals may be used to isolate the user design on the FPGA during certain test or debug operations (e.g., in a test mode using boundary scan).

A TAI IP (e.g., any of TAI IP 601-1 to 601-n) may operate from a faster clock than the user design. The faster clock increments or decrements the counter or counters which generate the addresses for accessing dynamically reconfigurable tag memories 801 and 802. Each counter has a programmable maximum or minimum count. Typically, when the maximum or minimum count is reached, the counter wraps around when the upper limit is reached, the counter is reset to zero. When the counter is reset at least once within a clock cycle of the user design clock, input and output of the signals from the user design and signals to be latched are appropriately accomplished. In this embodiment, the maximum or minimum count in each of the counters is programmable at run time by through SUB 107, so that the number of signals interchanged in each faster clock cycle can be varied dynamically. Because dynamically reconfigurable tag memories 801 and 802 may be written by the user or by runtime software through SUB 107, the signals output to or input from interconnection port 703 may be determined dynamically on a user clock cycle basis. This capability allows signal values or connection to be varied during testing or debug.

After the TAI IPs are inserted, at step 407, the compiler invokes place and route processes to operate on the netlist of each FPGA. The place and route processes are typically FPGA vendor-specific programs that translate each netlist into a file of a binary format or an ASCII format. The output file can be down-loaded then into the FPGAs of SR FPGA array 103. In one embodiment, the place and route processes are run on more than one user station or processor to allow the FPGA place and route tasks to run in parallel. The place and route binary or ASCII output files may be stored in user station 104 for further runtime software processing.

An IP library may be provided which includes, in addition to TAI IP, other IPs designed for circuit verification, circuit debug, and performance analysis functions. A system designer may include one or more such IPs to be included in a user design. Inclusion may be accomplished by a system designer directing the compiler to include such IPs or by manually instantiate the IPs in the source code for the user design.

IP intended for circuit verification ("Verification IPs") may include such circuits for simulating a USB bus or PCI bus, so as to allow verification of the user design's operation with connected to a USB bus or PCI bus. Verification IPs used in prototyping system 100 allow the user or run time software to access operational information provided by the verification IP creators or vendors over SUB 107. Typically, verification IPs monitor activities in the user design, check compliance with standardized communication or signal protocols, or compare the activities against a specified activity pattern ("golden pattern"). Verification IPs may provide analysis reports and error or warning information to the user or run time software.

IPs intended for debugging purpose ("Debug IPs") include, for example, IPs implementing an internal logic analyzer ("Internal Logic Analyzer IP") or a flow/state analyzer. These IPs allow a system designer to debug the configured system at runtime. For example, an Internal Logic analyzer IP may be used at specified trigger points to sampling the values of signals in the user design and store them to memory elements for subsequent analysis. Runtime software may access and manipulate these Debug IPs at runtime.

IPs intended for performance analysis ("Performance Analysis IPs") may IPs for bandwidth analysis. These IPs are used to gather performance information and analyze the performance of the user design. As with the other IPs, Performance Analysis IPs may communicate over SUB 107 with the user or runtime software to accomplish a performance analysis.

The runtime software in prototyping system 100 may include a dynamic configuration tool set and a system debugger tool set. The dynamic configuration tool set receives user commands to configure the FPGAs of SR FPGA array 103, the backplane and the TAI IPs to modify the operation modes, interconnections and even design functions at runtime. In one embodiment, in response to an FPGA configuration command, a FPGA configuration tool reads binary or ASCII FPGA configuration files and transfers the files to configuration controller 201 in system controller 102. This FPGA configuration tool may configure one or more FPGAs in SR FPGA array 103 separately, or even part of an FPGA, as required. For example, the user may modify a logic block in one FPGA. The modified logic block may be downloaded to the FPGA using the FPGA configuration tool, without reconfiguring any other FPGA.

In response to a backplane configuration command, a backplane configuration tool configures the configurable switches on a circuit board or backplane of SR FPGA array 103. Typically, any switches may be configured into an "on" state or an "Off" state. When a switch is in an "on" state, conductors coupled by the switch are connected. When a switch is in an "off" state, conductors coupled by the switch are electrically isolated from each other. The backplane configuration tool may be used, for example, to selectively configure portions of interconnection buses into local buses.

In response to a TAI IP configuration command, a TAI IP configuration tool generates data to be stored in one or more dynamically reconfigurable tag memories in the TAI IP cells over SUB 107. The data may represent interconnections between FPGAs or user requirements. For example, a user may wish to provide a value "1" at an input signal of a specified FPGA without recompilation. To accomplish this result, the TAI IP configuration tool re-calculates the tag memory word to implement the input signal, and writes the modified tag memory word to the selected dynamically reconfigurable tag memory.

The system debugger tool set gathers and analyzes design and debug information, and sets special conditions and signals to manipulate the operation of the user design at runtime. In one embodiment, the system debugger tool set includes (a) an FPGA read back tool, (b) a SUB access tool, (c) an internal logic analyzer tool, (d) a bandwidth analyzer tool, (e) a symbol/transaction extraction tool and (f) a simulator linkage tool.

The FPGA read back tool reads at run time the content of a specified FPGA or the states of specified signals in the user design. The FPGA read back tool may be obtained from a vendor, and may use a vendor-specific protocol, such as JTAG or SelectMAP, to read the content of a specified FPGA. Many FPGA vendors provide a tool to read any register or memory element in an FPGA. In this embodiment, after the data is read back from the FPGA, the FPGA read back tool translates the information read to signal values and map the information to the signal names and symbols in the user design. In this way, full visibility of any signal inside an FPGA is easily achieved.

The SUB access tool is used to access components, whether in the user design or included by prototyping system 100, connected to SUB 107. Components are address-mapped, so that access is accomplished by the SUB access tool reading and writing data into the components by providing commands, addresses and data to SUB controller 202 in system controller 102. In one embodiment, SUB 107 is extended to allow reading and writing data into any component on a circuit board of SR FPGA array 103.

The internal logic analyzer tool sets trigger conditions in a logic analyzer embedded in prototyping system 100. The logic analyzer is a specialized IP ("Logic Analyzer IP") down-loaded into one or more of the FPGAs in SR FPGA array 103. The Logic Analyzer IP may be provided the same functions as a conventional logic analyzer. With the TAI IPs in the FPGA, the Logic Analyzer IP can provide samples of a large number of signals and handles a large number of trigger conditions. In one embodiment, the internal logic analyzer tool sets trigger conditions at the embedded Logic Analyzer IP, waits for a trigger condition or event to happen, reads the signal sample data from embedded sample memory of the Logic Analyzer IP, and translates associates the sample data with the user defined symbols. In one embodiment, the internal logic analyzer tool sets a complicated event state machine embedded in the Logic Analyzer IP. The event state machine operates according to the event state machine to sample signal data for a debugging purpose. The internal logic analyzer tool, along with the Logic Analyzer IP, gives user the ability to monitor signals at run time conditions (e.g., an in-circuit mode operation), without interfering with the runtime operation of the user design.

The bandwidth analyzer tool analyzes the bandwidths of all system buses in SR FPGA array 103. The bandwidth analyzer tool gathers bus activity information from a "Bandwidth Analysis IP," which may be configured with the user design as required. The bandwidth analyzer tool analyzes and reports bandwidths, bus access latencies, arbitration overheads of the system buses. In one embodiment, the results may be displayed graphically, such as in a multi-dimensional graph.

The symbol/transaction extraction tool interprets the symbol and transaction level information from sampled signal data. The symbol/transaction extraction tool maps symbols and transactions from the sampled signal data and presents them to the user in a symbolic format. For example, in the bus "write" transaction described above, when the symbol/transaction extraction tool detects an instance of the "write" transaction, a message is created for the user indicating the time of occurrence of the bus "write" transaction, the write address and the write data involved in the transaction. This capability is valuable, for example, to a firmware designer in designing and debugging firmware programs.

The simulator linkage tool links a simulator running on user station 101 with the configured user design in SR FPGA 103 to perform a hardware/software co-emulation. The simulator linkage tool can handle simulators accessible through various known interfaces. For example, in one embodiment, a PLI or VPI interface is provided for communication with Verilog simulators, a FLI interface is provided for communicating with VHDL simulators and a SCEMI interface is provided for communicating with simulators with SCEMI interfaces. Other standard interfaces or user-defined interfaces may also be supported.

The above detailed description provided to illustrate the specific embodiments of the present invention and is not intended to be limiting. Numerous modifications and variations within the scope of the present invention are possible. The present invention is set forth in the following claims.

We claim:

1. A system for designing and emulating a user design, comprising:
    (i) a system controller comprising:
        (a) an interface to a user workstation; and
        (b) a data communication interface; and
    (ii) an emulation platform coupled to the data communication interface, comprising:
        (a) a plurality of field programmable logic devices for implementing the user design and third-party IP cores, wherein each programmable logic device is assigned for implementation an interface module through which a portion of the user design assigned to the programmable logic device communicates with portions of the user design assigned to other programmable logic devices; and
        (b) an interface to a target system with which the user design interacts at run time.

2. A system as in claim 1, wherein the data communication interface comprises a configuration bus.

3. A system as in claim 1, wherein the data communication interface comprises a system utility bus.

4. A system as in claim 1, wherein the data communication interface comprises a bus for clock signals.

5. A system as in claim 1, wherein the interface to a target system comprises signals originating from programmable input/output terminals of the programmable logic devices.

6. A system as in claim 1, wherein the field programmable logic devices comprise field programmable gate arrays.

7. A system as in claim 1, wherein the interface module comprises: (a) a control circuit; and (b) a plurality of input/output cells, each providing a 1-bit interconnection port.

8. A system as in claim 7, wherein each input/output cell comprises:
    (a) dynamically reconfigurable memory module;
    (b) a multiplexer, controlled by the dynamically reconfigurable memory module, for selecting an output signal for output onto the 1-bit interconnection port from a plurality of signals configured in the programmable logic device; and
    (c) a plurality of latches each selectable by the dynamically reconfigurable memory module, to receive a signal from the 1-bit interconnection port.

9. A system as in claim 8, wherein the dynamically reconfigurable memory module comprises one or more dynamically reconfigurable memory elements.

10. A system as in claim 8, further comprising a second multiplexer, controlled by the dynamically reconfigurable memory module, for selecting an output enable signal from a plurality of output enable signals for controlling a buffer asserting the output signal onto the 1-bit interconnection port.

11. A system as in claim 10, wherein the buffer is capable of a high-impedance state.

12. A system as in claim 10, wherein each output signal correspond to an output enable signal.

13. A system as in claim 7, wherein the output signals comprise constant signals.

14. A system as in claim 1, wherein a selected number of the programmable logic devices are assigned third-party IP cores.

15. A system as in claim 1, wherein one or more of the programmable logic devices are assigned a verification IP core for verifying functional operation of the user circuit.

16. A system as in claim 15, wherein the verification IP core comprises a circuit for simulating the operations of an industry standard data bus.

17. A system as in claim 1, wherein one or more of the programmable logic devices are assigned a performance analysis IP core.

18. A system as in claim 17, wherein the performance analysis IP core comprises an IP core for bandwidth analysis.

19. A system as in claim 1, further comprising a configuration tool capable of dynamically reconfiguring logic circuits assigned to a selected programmable logic device.

20. A system as in claim 1, further comprising a backplane configuration tool capable of dynamically reconfiguring buses on a circuit board on which the programmable logic devices are located.

21. A system as in claim 1, further comprising a system debugger tool for monitoring and analyzing signals in and between the programmable logic devices during run time.

22. A system as in claim 21, wherein the system debugger tool comprises an FPGA read back tool.

23. A system as in claim 21, wherein the system debugger tool comprises a system utility bus access tool.

24. A system as in claim 21, wherein the system debugger tool comprises an internal logic analyzer tool.

25. A system as in claim 24, wherein the internal logic analyzer tool includes in one or more of the programmable logic devices a circuit implementing a logic analyzer.

26. A system as in claim 21, wherein the system debugger tool comprises a simulator linkage tool.

27. A system as in claim 26, wherein the simulator linkage tool allows the user design to interact with a simulator program running on the user station in a co-simulation arrangement.

28. A system as in claim 21, wherein the system debugger tool comprises a bandwidth analyzer tool.

29. A system as in claim 21, wherein the system debugger tool comprises a symbol/transaction extraction tool.

30. A system as in claim 29, wherein the symbol/transaction extraction tool allows a user to associate one or more signals with a symbolic name.

31. A system as in claim 30, wherein the symbol/transaction extraction tool allows a user to specify a transaction which involves a plurality of signals by specifying signal transitions in the waveforms of the signals.

32. A system as in claim 31, wherein the symbol/transaction extraction tool reports detection of the specified transaction using the associated symbols.

33. A method for emulating a user design, comprising:
(i) providing a system controller comprising:
(a) an interface to a user workstation; and
(b) a data communication interface;
(ii) providing an emulation platform coupled to the data communication interface, comprising:
(a) a plurality of field programmable logic devices for implementing the user design; and
(b) an interface to a target system with which the user design interacts at run time;
(iii) generating a top-level module including the user design and one or more third party IP cores;
(iv) synthesizing the user design;
partitioning the user design and the third party IP cores into partitions each suitable for implementing in one of the programmable logic devices;
(v) assigning to each programmable logic device an interface module through which the partition to be implemented in that programmable logic device is allowed communicate with other partitions in other programmable logic devices;
(vi) placing and routing the partitions and the interface modules; and
(vii) implementing the placed and routed partitions in the programmable logic devices.

34. A method as in claim 33, wherein the data communication interface comprises a configuration bus.

35. A method as in claim 33, wherein the data communication interface comprises a system utility bus.

36. A method as in claim 33, wherein the data communication interface comprises a bus for clock signals.

37. A method as in claim 33, wherein the interface to a target system comprises signals originating from programmable input/output terminals of the programmable logic devices.

38. A method as in claim 33, wherein the field programmable logic devices comprise field programmable gate arrays.

39. A method as in claim 33, wherein the interface module comprises:
(a) a control circuit; and
(b) a plurality of input/output cells, each providing a 1-bit interconnection port.

40. A method as in claim 39, wherein each input/output cell comprises:
(a) dynamically reconfigurable memory module;
(b) a multiplexer, controlled by the dynamically reconfigurable memory module, for selecting an output signal for output onto the 1-bit interconnection port from a plurality of signals configured in the programmable logic device; and
(c) a plurality of latches each selectable by the dynamically reconfigurable memory module, to receive a signal from the 1-bit interconnection port.

41. A method as in claim 40, wherein the dynamically reconfigurable memory module comprises one or more dynamically reconfigurable memory elements.

42. A method as in claim 40, wherein each input/output cell further comprises a second multiplexer, controlled by the dynamically reconfigurable memory module, for selecting an output enable signal from a plurality of output enable signals for controlling a buffer asserting the output signal onto the 1-bit interconnection port.

43. A method as in claim 42, wherein the buffer is capable of a high-impedance state.

44. A method as in claim 42, wherein each output signal correspond to an output enable signal.

45. A method as in claim 40, wherein the output signals comprise constant signals.

46. A method as in claim 33, further comprising assigning to one or more of the programmable logic devices each a verification IP core for verifying functional operation of the user circuit.

47. A method as in claim 46, wherein the verification IP core comprises a circuit for simulating the operations of an industry standard data bus.

48. A method as in claim 33, further comprising assigning a performance analysis IP core to one or more of the programmable logic devices.

49. A method as in claim 48, wherein the performance analysis IP core core comprises an IP core for bandwidth analysis.

50. A method as in claim 33, further comprising providing a configuration tool capable of dynamically reconfiguring logic circuits assigned to a selected programmable logic device.

51. A method as in claim 33, further comprising providing a backplane configuration tool capable of dynamically reconfiguring buses on a circuit board on which the programmable logic devices are located.

52. A method as in claim 33, further comprising providing a system debugger tool for monitoring and analyzing signals in and between the programmable logic devices during run time.

53. A method as in claim 52, wherein the system debugger tool comprises an FPGA read back tool.

54. A method as in claim 52, wherein the system debugger tool comprises a system utility bus access tool.

55. A method as in claim 52, wherein the system debugger tool comprises an internal logic analyzer tool.

56. A method as in claim 55, further comprising assigning in one or more of the programmable logic devices a circuit implementing a logic analyzer.

57. A method as in claim 52, wherein the system debugger tool comprises a bandwidth analyzer tool.

58. A method as in claim 52, wherein the system debugger tool comprises a symbol/transaction extraction tool.

59. A method as in claim 58, wherein the symbol/transaction extraction tool allows a user to associate one or more signals with a symbolic name.

60. A method as in claim 58, wherein the symbol/transaction extraction tool allows a user to specify a transaction involved a plurality of signals by specifying signal transitions in the waveforms of the signals.

61. A method as in claim 58, wherein the symbol/transaction extraction tool reports detection of the specified transaction using the associated symbols.

62. A method as in claim 52, wherein the debugger tool comprises a simulator linkage tool.

63. A method as in claim 62, wherein the simulator linkage tool allows the user design to interact with a simulator program running on the user station in a co-simulation arrangement.

* * * * *